(12) United States Patent
Okajima

(10) Patent No.: US 9,214,905 B2
(45) Date of Patent: Dec. 15, 2015

(54) HIGH OUTPUT POWER AMPLIFIER

(71) Applicant: Panasonic Corporation, Kadoma-shi, Osaka (JP)

(72) Inventor: Toshiyuki Okajima, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 9 days.

(21) Appl. No.: 14/364,575

(22) PCT Filed: Nov. 9, 2012

(86) PCT No.: PCT/JP2012/007200
§ 371 (c)(1),
(2) Date: Jun. 11, 2014

(87) PCT Pub. No.: WO2013/088635
PCT Pub. Date: Jun. 20, 2013

(65) Prior Publication Data
US 2014/0300422 A1    Oct. 9, 2014

(30) Foreign Application Priority Data

Dec. 15, 2011 (JP) .................................. 2011-274167

(51) Int. Cl.
*H03F 3/04* (2006.01)
*H03F 3/213* (2006.01)
(Continued)

(52) U.S. Cl.
CPC .............. *H03F 3/213* (2013.01); *H03F 1/0261* (2013.01); *H03F 1/523* (2013.01); *H03F 3/193* (2013.01); *H03F 3/195* (2013.01); *H03F 3/245* (2013.01);
(Continued)

(58) Field of Classification Search
USPC ......................................... 330/296, 297, 253
IPC .......................................................... H03F 3/04
See application file for complete search history.

(56) References Cited

U.S. PATENT DOCUMENTS 5,327,583 A * 7/1994 Yamada et al. ............... 455/572
2004/0264091 A1 * 12/2004 Ishida .......................... 361/93.1
(Continued)

FOREIGN PATENT DOCUMENTS

| EP | 1 403 656 A2 | 3/2004 |
| EP | 1 811 658 A1 | 7/2007 |

(Continued)

OTHER PUBLICATIONS

International Preliminary Report on Patentability, and English translation thereof, in corresponding International Application No. PCT/JP2012/007200, dated Jun. 26, 2014, 11 pages.

(Continued)

*Primary Examiner* — Patricia T Nguyen
(74) *Attorney, Agent, or Firm* — Brinks Gilson & Lione

(57) ABSTRACT

A high-output electric power amplifier using a depression-type FET includes a drain voltage supply portion adapted to create a positive voltage to be applied to a drain terminal in the depression-type FET, and a gate bias voltage supply portion adapted to create a negative voltage to be applied to a gate terminal in the depression-type FET, wherein the drain voltage supply portion uses an external commercial power supply as an electric power source, and the gate bias voltage supply portion uses a battery as an electric power source, in order to certainly prevent breakdowns of the FET due to excessive electric currents.

4 Claims, 5 Drawing Sheets

(51) Int. Cl.
*H03F 1/02* (2006.01)
*H03F 1/52* (2006.01)
*H03F 3/193* (2006.01)
*H03F 3/24* (2006.01)
*H03F 3/72* (2006.01)
*H03F 3/195* (2006.01)

(52) U.S. Cl.
CPC ............ *H03F 3/72* (2013.01); *H03F 2200/108* (2013.01); *H03F 2200/15* (2013.01); *H03F 2200/18* (2013.01); *H03F 2200/181* (2013.01); *H03F 2200/451* (2013.01); *H03F 2200/471* (2013.01); *H03F 2200/555* (2013.01); *H03F 2203/7206* (2013.01); *H03F 2203/7221* (2013.01); *H03F 2203/7227* (2013.01)

(56) References Cited

U.S. PATENT DOCUMENTS

2009/0256599 A1* 10/2009 Shinomiya et al. ........... 327/143
2014/0070890 A1* 3/2014 Iyomasa et al. ............... 330/296

FOREIGN PATENT DOCUMENTS

| JP | 58-127706 U | 8/1983 |
| JP | 03-026028 A | 2/1991 |
| JP | 05-175750 A | 7/1993 |
| JP | 9-181534 A | 7/1997 |
| JP | 09-238030 A | 9/1997 |
| JP | 2000-068756 A | 3/2000 |
| JP | 2010-103796 A | 5/2010 |

OTHER PUBLICATIONS

International Search Report issued in PCT/JP2012/007200 dated Jan. 17, 2013, 2 pages.

Extended European Search Report in corresponding European Application No. 12858137.8, dated Apr. 1, 2015, 7 pages.

* cited by examiner

HIGH OUTPUT POWER AMPLIFIER

This application is a 371 application of PCT/JP2012/007200 having an international filing date of Nov. 9, 2012, which claims priority to JP2011-274167 filed Dec. 15, 2011, the entire contents of which are incorporated herein by reference.

TECHNICAL FIELD

The present invention relates to high-output electric power amplifiers for amplifying high-frequency electric power of several tens of watts to several hundreds of watts. More specifically, the present invention relates to techniques for preventing breakdowns of amplification devices due to excessive electric currents, in high-output electric power amplifiers structured to include depression-type FETs as amplification devices.

BACKGROUND ART

In recent years, regarding high electric power amplifiers used in base stations for radio communication systems and in heating apparatuses using microwaves, there have been stepped-up technical developments for high-efficiency compound power semiconductor devices which have high withstand voltages and high electric power densities and are capable of high-speed operations and are made of wide-gap semiconductors such as silicon carbide (SiC), gallium nitride (GaN), for example. As a result, energy saving is advanced in the high electric power amplifiers.

In cases of using such compound power semiconductor devices for high-speed operations with larger electric power, in general, depression-type device structures have been employed, in order to realize higher electric power densities for providing larger output amplitudes.

Such a depression-type FET has a normally-ON characteristic, which necessarily necessitates applying a gate bias voltage which is a negative voltage to the gate terminal thereof. If a drain voltage is applied to the drain terminal in such a depression-type FET, in a state where no gate bias voltage is applied to the depression-type FET, this causes a larger electric current to flow through the depression-type FET, which induces damages of the depression-type FET, thereby causing breakdowns thereof at the worst.

In order to prevent damages or breakdowns of the FET when a drain voltage is applied to the drain terminal in a state where no gate bias voltage is applied thereto, as described above, there is provided a comparator adapted to make a comparison between a reference voltage and the gate voltage applied to the gate electrode in the electric power amplifier for determining whether or not the gate voltage is normal, and, further, there is provided a switch for applying the drain voltage to the drain electrode in the electric power amplifier. In activating the electric power amplifier as described above, at first, a negative-voltage generator for generating a gate voltage is activated, further, the comparator is caused to recognize that the gate voltage has reached a predetermined negative electric potential and, thereafter, the switch is turned on, thereby applying the drain voltage to the drain electrode in the electric power amplifier. The technique described above is disclosed in Patent Literature 1.

According to the technique disclosed in Patent Literature 1, in the event of defects of the circuit for creating the negative voltage to be applied to the gate electrode, the application of the voltage to the drain electrode is automatically inhibited, which protects the electric power amplifier against breakdowns in the event of defects of the creation of the negative voltage.

Further, Patent Literature 2 discloses a technique as follows. There are provided an opening/closing means between a power supply and an electric power amplifier, and a charging circuit having a predetermined time constant. In applying the power supply thereto, the opening/closing means is controlled to be brought into an opened state, further, when the negative voltage has reached a predetermined voltage, the charging circuit starts being charged, and when the charging voltage in the charging circuit has reached a predetermined voltage, the opening/closing means is brought into a closed state.

According to the technique disclosed in Patent Literature 2, in applying the power supply thereto, the power supply voltage is not applied to the electric power amplifier, and after the elapse of the time taken for the negative voltage to reach the predetermined voltage, and the time taken for the voltage charged in the charging circuit to bring the opening/closing means into the closed state, the power supply voltage is applied thereto. This prevents excessive electric currents from flowing through the electric power amplifier, thereby preventing breakdowns of the electric power amplifier.

PLT 1: Unexamined Japanese Patent Publication No. 119-238030

PLT 2: Unexamined Japanese Patent Publication No. 2000-68756

SUMMARY OF THE INVENTION

Technical Problem

However, the conventional structure disclosed in Patent Literature 1 employs the comparator for determining whether or not the negative voltage as the gate voltage is the predetermined voltage and for performing ON/OFF control of the switch for the drain voltage. At the time of turn-on of the power supply, or in the event of accidental power supply shutdowns, such as power failures or pull-out of the power-supply outlet plug, the output of the comparator may be temporarily brought into un-stabilized states. In such states, the switch may be turned on, thereby applying the drain voltage to the drain electrode, even though the negative voltage as the gate voltage has not reached the predetermined voltage.

Further, the conventional structure disclosed in Patent Literature 2 employs the charging circuit for controlling the opening/closing means for supplying the power supply to the electric power amplifier. Therefore, in the event of shutdowns of the negative voltage in a state where the charging circuit has been charged, the opening/closing means is kept in the closed state, during the time taken for the voltage in the charging circuit to drop to the predetermined voltage at the time constant of the charging circuit. This may cause the power supply to be supplied to the electric power amplifier, in the state where the negative voltage is not applied thereto.

Further, in both the conventional structures disclosed in Patent Literatures 1 and 2, the ON/OFF control of the bias voltage based on the state of the negative voltage is realized by an active circuit using semiconductors. Therefore, with the aforementioned conventional structures, in the event of degradations, failures and the like of the structural devices, the protecting circuit may be prevented from normally operating, which may cause the drain voltage to be applied to the drain electrode, in states where no gate bias voltage is applied thereto. This may induce damages or breakdowns of the FET.

Accordingly, any of these conventional structures has not provided sufficient measures for preventing breakdowns of the FET.

The present invention was made to overcome the problems in the aforementioned conventional structures and aims at providing a high-output electric power amplifier which employs a depression-type FET and is capable of certainly preventing breakdowns of the FET due to excessive electric currents, even in the event of accidental power supply shutdowns, and malfunctions and failures of the control microcomputer.

Solution to Problem

In order to overcome the problems in the conventional structures, a high-output electric power amplifier according to the present invention is configured to include a depression-type FET as an amplification device, and the high-output electric power amplifier comprises:

a drain voltage supply portion adapted to create and output a positive voltage to be applied to a drain terminal in the depression-type FET; and a gate bias voltage supply portion adapted to create and output a negative voltage to be applied to a gate terminal in the depression-type FET;

wherein the drain voltage supply portion uses an external commercial power supply as an electric power source, and the gate bias voltage supply portion uses a battery as an electric power source.

With the aforementioned structure, in the high-output electric power amplifier according to the present invention, the drain voltage, which is a positive voltage created by the drain voltage supply portion with the external commercial power supply used as an electric power source, is applied to the drain terminal, while the gate bias voltage, which is a negative voltage created by the gate bias voltage supply portion with the battery used as an electric power source, is applied to the gate terminal. Accordingly, in the high-output electric power amplifier according to the present invention, the battery is used as the electric power source for the gate bias voltage, which is independent of the electric power source for the drain voltage. Since the gate bias voltage, which is continuously stabilized, can be applied to the gate terminal, it can certainly prevent breakdowns of the FET due to excessive electric currents, even in the event of accidental power supply shutdowns, and malfunctions and failures of the control microcomputer.

Advantageous Effects of the Invention

The high-output electric power amplifier according to the present invention has a structure capable of certainly preventing breakdowns of the FET due to excessive electric currents, even in the event of accidental power supply shutdowns, and malfunctions and failures of the control microcomputer.

DETAILED DESCRIPTION OF THE PREFERRED EMBODIMENTS

Figure 1:
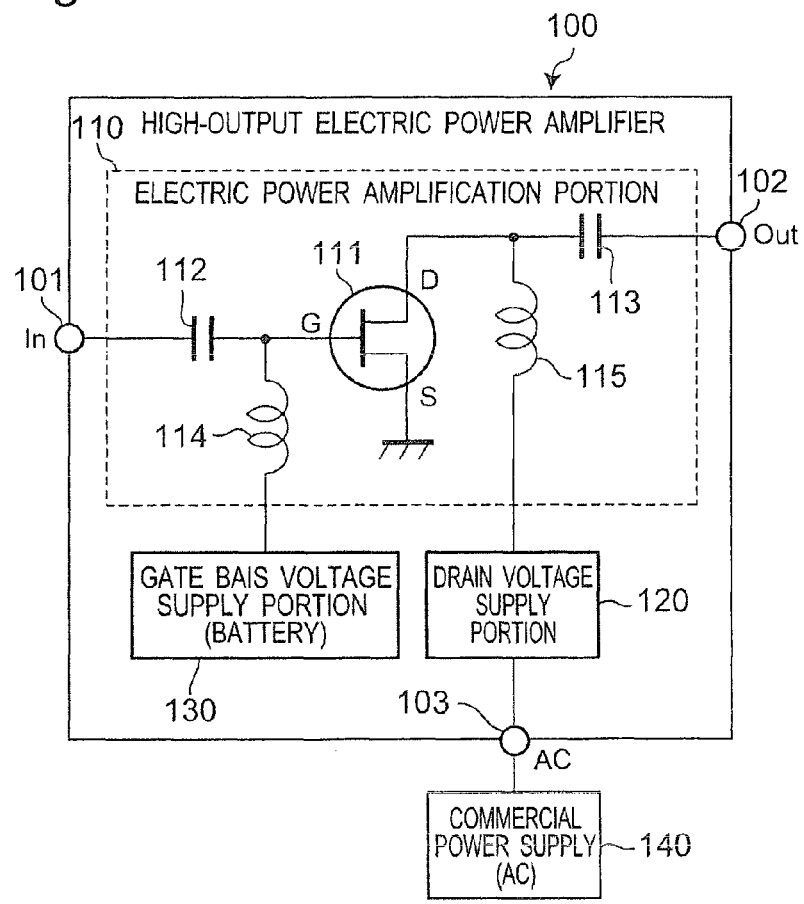
FIG. 1 is a block diagram illustrating a basic structure of a high-output electric power amplifier according to a first embodiment of the present invention.

A high-output electric power amplifier of a first aspect according to the present invention is configured to include a depression-type FET as an amplification device, and the high-output electric power amplifier comprises:

a drain voltage supply portion adapted to create and output a positive voltage to be applied to a drain terminal in the depression-type FET; and a gate bias voltage supply portion adapted to create and output a negative voltage to be applied to a gate terminal in the depression-type FET, wherein the high-output electric power amplifier is configured that the drain voltage supply portion uses an external commercial power supply as an electric power source, and the gate bias voltage supply portion uses a battery as an electric power source.

With the high-output electric power amplifier having the aforementioned structure in the first aspect according to the present invention, the drain voltage, which is the positive voltage created by the drain voltage supply portion with the external commercial power supply used as the electric power source, is applied to the drain terminal, while the gate bias voltage, which is the negative voltage created by the gate bias voltage supply portion with the battery used as the electric power source, is applied to the gate terminal. Accordingly, in the high-output electric power amplifier in the first aspect, the battery is used as the electric power source for the gate bias voltage, which is independent of the electric power source for the drain voltage. This enables applying the gate bias voltage which is continuously stabilized, to the gate terminal. As a result thereof, with the high-output electric power amplifier in the first aspect, it is possible to certainly prevent breakdowns of the FET due to excessive electric currents, even in the event of accidental power supply shutdowns, and malfunctions and failures of the control microcomputer.

In a high-output electric power amplifier of a second aspect according to the present invention, preferably, the gate bias voltage supply portion in the above-mentioned first aspect includes a battery forming an electric power source for a gate bias voltage, a transformer circuit and a smoothing circuit which are adapted to create a negative voltage to be applied to the gate terminal in the depression-type FET, from an output voltage from the battery, and a gate bias voltage monitoring portion adapted to monitor the gate bias voltage applied to the gate terminal in the depression-type FET, which is created by the transformer circuit and the smoothing circuit, the drain voltage supply portion includes a rectification circuit, a transformer circuit and a smoothing circuit which are adapted to create a positive voltage to be applied to the drain terminal in the depression-type FET, from electric power supplied from the external commercial power supply, and a drain voltage output ON/OFF portion which is adapted to turn on/off the output of the positive voltage applied to the drain terminal in the depression-type FET, which is created by the rectification circuit, the transformer circuit and the smoothing circuit, the gate bias voltage monitoring portion is adapted to output, to the drain voltage output ON/OFF portion, a control signal indicative of the fact that the gate bias voltage is normal, when the gate bias voltage applied to the gate terminal in the depression-type FET falls within a predetermined permissible range, and the drain voltage output ON/OFF portion is adapted to output the drain voltage, only when receiving the control signal outputted from the gate bias voltage monitoring portion.

With the high-output electric power amplifier having the aforementioned structure in the second aspect according to the present invention, the drain voltage output ON/OFF portion is brought into an ON state, thereby applying the drain voltage to the drain terminal, only when the gate bias voltage applied to the gate terminal falls within the predetermined permissible range. Therefore, with the high-output electric power amplifier in the second aspect, the drain voltage output ON/OFF portion is brought into an OFF state, in the event of voltage drops and failures of the battery. This can certainly prevent breakdowns of the FET due to excessive electric currents.

In a high-output electric power amplifier of a third aspect according to the present invention, preferably, the drain voltage output ON/OFF portion in the above-mentioned second aspect is configured to employ, as an opening/closing device, a contact relay adapted to be closed only in a state where a control signal is inputted to an opening/closing control terminal.

With the high-output electric power amplifier having the aforementioned structure in the third aspect according to the present invention, except when the gate bias voltage is normal, it is possible to certainly maintain the state where the drain voltage is not applied to the drain terminal by using passive elements, with a smaller number of components. Accordingly, with the high-output electric power amplifier in the third aspect, it is possible to further improve the reliability of the protecting circuit for preventing breakdowns of the FET due to excessive electric currents.

In a high-output electric power amplifier of a fourth aspect according to the present invention, preferably, the gate bias voltage supply portion in the above-mentioned second aspect includes a rechargeable battery forming an electric power source for the gate bias voltage, a charging circuit adapted to charge the rechargeable battery, and a battery-level monitoring portion adapted to monitor an output voltage from the rechargeable battery, and wherein the charging circuit is connected to the external commercial power supply and is adapted to perform an operation for charging the rechargeable battery, when the value from the battery-level monitoring portion reaches a first value.

With the high-output electric power amplifier having the aforementioned structure in the fourth aspect according to the present invention, the rechargeable battery is automatically charged, at a time point when the voltage from the rechargeable battery has dropped to a certain voltage due to discharge of the rechargeable battery. Accordingly, with the high-output electric power amplifier in the fourth aspect, it is possible to continuously maintain a voltage equal to or more than a certain value, from the rechargeable battery as the electric power source for the gate bias voltage. This can eliminate the labor for replacement of the battery and, also, can eliminate concerns about drops of the voltage from the rechargeable battery, even when it is continuously operated. As a result thereof, with the high-output electric power amplifier in the fourth aspect, it is possible to continuously apply a stabilized gate bias voltage to the gate terminal, so that it can certainly prevent breakdowns of the FET due to excessive electric currents.

Hereinafter, embodiments of the high-output electric power amplifier according to the present invention will be described, with reference to the accompanying drawings. Further, the present invention is not restricted to the structures according to the embodiments which will be described hereinafter and is intended to cover high-output electric power amplifiers structured based on technical concepts equivalent to those of the structures of the high-output electric power amplifiers which will be described in the following embodiments.

First Embodiment

FIG. 1 is a block diagram illustrating a basic structure of a high-output electric power amplifier 100 according to a first embodiment of the present invention.

The high-output electric power amplifier 100 according to the first embodiment includes an input terminal 101, an output terminal 102, an external power supply connection terminal 103, an electric power amplification portion 110, a drain voltage supply portion 120, and a gate bias voltage supply portion 130. Further, in FIG. 1, the high-output electric power amplifier 100 is configured to have the single electric power amplification portion 110, the single input terminal 101, and the single output terminal 102. However, the configuration of the high-output electric power amplifier according to the present invention is not limited to such a structure having a single electric power amplification portion, a single input terminal, and a single output terminal.

The drain voltage supply portion 120 is connected to the external power supply connection terminal 103 and is adapted to create a drain voltage which is a positive voltage from an AC electric power inputted through the external power supply connection terminal 103 and to supply it to the electric power amplification portion 110. The concrete structure of the drain voltage supply portion 120 will be described, in detail, later.

The gate bias voltage supply portion 130 has a battery and is adapted to create a gate bias voltage, which is a negative voltage, from a DC voltage outputted from this battery and to supply it to the electric power amplification portion 110. The concrete structure of the gate bias voltage supply portion 130 will be described, in detail, later.

The external power supply connection terminal 103 is adapted to be connectable to an external commercial power supply 140 and is constituted by an outlet plug and an electric code with two or three cores, for example.

Next, the concrete structure of the electric power amplification portion 110 will be described, in detail.

As illustrated in FIG. 1, the electric power amplification portion 110 includes a depression-type FET 111, an input DC cut capacitor 112, an output DC cut capacitor 113, a gate bias inductor 114, and a drain bias inductor 115.

AC electric power (for example, high-frequency electric power) inputted through the input terminal 101 is inputted to the gate terminal in the depression-type FET 111, through the input DC cut capacitor 112. The AC electric power (for example, high-frequency electric power) inputted to the gate terminal in the depression-type FET 111 is amplified thereby, and this amplified electric power is outputted from the drain terminal in the same depression-type FET 111. The AC electric power (for example, high-frequency electric power) which is outputted from the drain terminal in the depression-type FET 111 is outputted from the output terminal 102, through the output DC cut capacitor 113. The input DC cut capacitor 112 and the output DC cut capacitor 113 are provided, in order to prevent the gate bias voltage which is the negative voltage applied to the gate terminal and the drain voltage which is the positive voltage applied to the drain terminal, in the depression-type FET 111, from being outputted to the input terminal 101 and the output terminal 102. The capacitance values of the input DC cut capacitor 112 and the output DC cut capacitor 113 are determined, such that the impedance is made smaller, for the frequency of the AC electric power (for example, high-frequency electric power) which is inputted to the input terminal 101.

The gate bias voltage inputted from the gate bias voltage supply portion 130 is applied to the gate terminal of the depression-type FET 111, through the gate bias inductor 114. The drain voltage inputted from the drain voltage supply portion 120 is applied to the drain terminal of the depression-type FET 111, through the drain bias inductor 115. The gate bias inductor 114 and the drain bias inductor 115 are provided, in order to prevent the occurrence of electric power losses, due to flow of the AC electric power (for example, high-frequency electric power) inputted to the gate terminal, and the AC electric power (for example, high-frequency electric power) outputted from the drain terminal of the depression-type FET 111 into the path for applying the gate bias voltage to the gate terminal and into the path for applying the drain voltage to the drain terminal of the depression-type FET 111. The inductance values of the gate bias inductor 114 and the drain bias inductor 115 are determined, such that the impedance is made sufficiently larger, for the frequencies of the AC electric power (for example, high-frequency electric power) inputted to the gate terminal, and the AC electric power (for example, high-frequency electric power) outputted from the drain terminal, in the depression-type FET 111.

Figure 2:
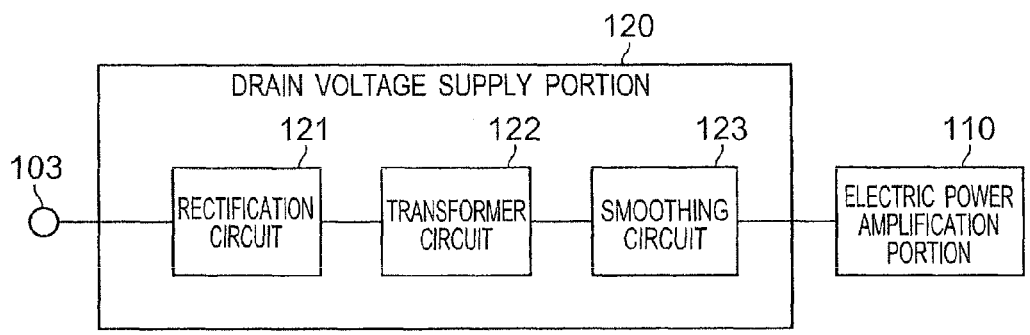
FIG. 2 is a block diagram illustrating a concrete structure of a drain voltage supply portion according to the first embodiment of the present invention.

Next, the concrete structure of the drain voltage supply portion 120 will be described, in detail. FIG. 2 is a block diagram illustrating the concrete structure of the drain voltage supply portion 120, in detail.

As illustrated in FIG. 2, the drain voltage supply portion 120 includes a rectification circuit 121, a transformer circuit 122, and a smoothing circuit 123, which are connected to each other in the mentioned order.

The rectification circuit 121 is adapted to rectify the AC voltage inputted from the external power supply connection terminal 103 and to output it to the transformer circuit 122. The rectification circuit 121 can be constituted by, for example, an ordinary bridge diode circuit constituted by four rectification diodes connected to each other in a ring shape.

The transformer circuit 122 is adapted to convert the rectified voltage inputted from the rectification circuit 121 into a voltage as a desired drain voltage to be supplied to the electric power amplification portion 110 and to output it to the smoothing circuit 123. The transformer circuit 122 can be constituted by an isolation transformer having a winding ratio corresponding to a desired voltage-transformation ratio. The rectification circuit 121 is connected, at its output, to the primary-side coil in the isolation transformer, while the smoothing circuit 123 is connected, at its input, to the secondary-side coil in the isolation transformer. The rectified voltage resulted from the rectification by the rectification circuit 121, which is inputted to the primary-side coil in the isolation transformer, is transformed to a voltage corresponding to the winding ratio between the primary-side coil and the secondary-side coil in the isolation transformer, and this transformed voltage is outputted to the secondary-side coil in the isolation transformer and is inputted to the smoothing circuit 123. Also, the transformer circuit 122 can be formed from a switching power supply circuit, by providing a smoothing capacitor in the output of the rectification circuit 121, further providing a switching MOSFET in the grounded-potential-side of the primary-side coil in the isolation transformer, and causing this switching MOSFET to perform switching operations. By forming the transformer circuit 122 from such a switching power supply circuit, and by increasing the switching frequency of the switching MOSFET, it is possible to reduce the size of the isolation transformer. Further, by changing the ON/OFF time ratio in the switching operations of the switching MOSFET, it is possible to arbitrarily change the voltage-transformation ratio, which can easily realize the transformer circuit 122 of a variable output-voltage type.

The smoothing circuit 123 smoothens the transformed voltage inputted from the transformer circuit 122 and outputs it as a drain voltage to the electric power amplification portion 110. The smoothing circuit 123 can be constituted by an ordinary smoothing circuit constituted by a rectification diode and a smoothing capacitor.

As described above, the drain voltage supply portion 120 has the structure illustrated in FIG. 2 and, thus, is adapted to create a drain voltage to be supplied to the electric power amplification portion 110, from the AC voltage from the external commercial power supply 140, which is inputted to the drain voltage supply portion 120 through the external power supply connection terminal 103.

Figure 3:
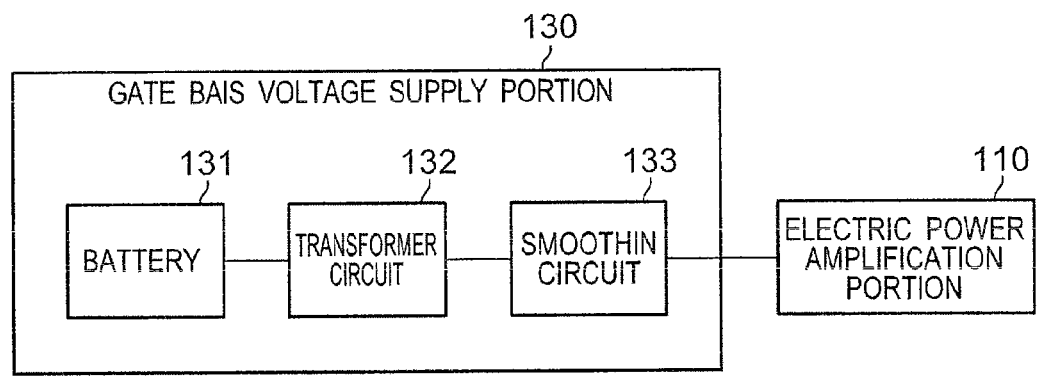
FIG. 3 is a block diagram illustrating a concrete structure of a gate bias voltage supply portion according to the first embodiment of the present invention.

Next, the concrete structure of the gate bias voltage supply portion 130 will be described, in detail. FIG. 3 is a block diagram illustrating the concrete structure of the gate bias voltage supply portion 130, in detail.

As illustrated in FIG. 3, the gate bias voltage supply portion 130 is constituted by a battery 131, a transformer circuit 132, and a smoothing circuit 133.

The battery 131 is connected, at its output, to the transformer circuit 132. The battery 131 is an ordinary primary battery and can be constituted by a manganese dry battery, an alkaline primary battery, a lithium primary battery, or the like.

The transformer circuit 132 is adapted to convert the DC voltage inputted from the battery 131 into a voltage as a desired gate bias voltage to be supplied to the electric power amplification portion 110 and to output it to the smoothing circuit 133. The transformer circuit 132 can be constituted by an ordinary switching power supply circuit constituted by an isolation transformer and a switching MOSFET. By adjusting the ON/OFF time ratio in the switching operations of the switching MOSFET, it is possible to set the voltage outputted to the smoothing circuit 133 to be an arbitrary voltage.

The smoothing circuit 133 smoothens the transformed voltage inputted from the transformer circuit 132 and outputs it as a gate bias voltage to the electric power amplification portion 110. The smoothing circuit 133 can be constituted by an ordinary smoothing circuit constituted by a rectification diode and a smoothing capacitor.

As described above, the gate bias voltage supply portion 130 has the structure illustrated in FIG. 3 and, thus, is adapted to create a gate bias voltage to be supplied to the electric power amplification portion 110, from the voltage outputted from the battery 131.

With the structure of the high-output electric power amplifier 100 according to the aforementioned first embodiment, the drain voltage, which is a positive voltage created by the drain voltage supply portion 120 with the external commercial power supply 140 used as an electric power source, is applied to the drain terminal of the depression-type FET 111, while the gate bias voltage, which is a negative voltage created by the gate bias voltage supply portion 130 with the battery 131 used as an electric power source, is certainly applied to the gate terminal thereof. This enables applying the gate bias voltage which is continuously stabilized, to the gate terminal in the depression-type FET 111, which can certainly prevent breakdowns of the FET due to excessive electric currents, even in the event of accidental power supply shutdowns, and malfunctions and failures of the control microcomputer.

Second Embodiment

Hereinafter, a high-output electric power amplifier according to a second embodiment of the present invention will be described, with reference to the accompanying drawings.

In the high-output electric amplifier according to the aforementioned first embodiment, the drain voltage supply portion 120 is configured to include the rectification circuit 121, the transformer circuit 122, and the smoothing circuit 123, in order to output a drain voltage, which is a positive voltage, from an AC voltage introduced from the external commercial power supply 140. Further, the gate bias supply portion 130 according to the first embodiment is configured to include the battery 131, and the transformer circuit 132 and the smoothing circuit 133 which are adapted to output a gate bias voltage which is a negative voltage, from the output voltage from the battery 131. In comparison with the high-output electric power amplifier having this structure according to the first embodiment, the high-output electric power amplifier according to the second embodiment is adapted to include a drain voltage supply portion including a drain voltage output ON/OFF portion as a drain voltage output ON/OFF means, in addition to the rectification circuit 121, the transformer circuit 122 and the smoothing circuit 123, in order to enable ON/OFF control of the drain voltage output to an electric power amplification portion from the drain voltage supply portion. Further, a gate bias voltage supply portion includes a gate bias voltage monitoring portion as a gate bias voltage monitoring means for determining whether or not the gate bias voltage supplied to the electric power amplification portion from the gate bias voltage supply portion falls within a predetermined permissible range, in addition to the battery 131, the transformer circuit 132, and the smoothing circuit 133. With regard to these points, the structure according to the second embodiment is different from the structure according to the first embodiment.

The high-output electric power amplifier having the aforementioned structure according to the second embodiment is capable of supplying the drain voltage, only when the gate bias voltage falls within the predetermined permissible range. This can certainly prevent breakdowns of the FET due to excessive electric currents, even in the event of voltage drops and failures of the battery.

Hereinafter, the high-output electric power amplifier according to the second embodiment will be described, mainly with respect to the differences thereof from the high-output electric power amplifier according to the first embodiment. Further, in the description of the second embodiment, components having the same functions as those in the aforementioned first embodiment will be designated by the same reference characters and will not be described. Further, in the second embodiment, contents having the same effects as those in the aforementioned first embodiment will not be described.

Figure 4:
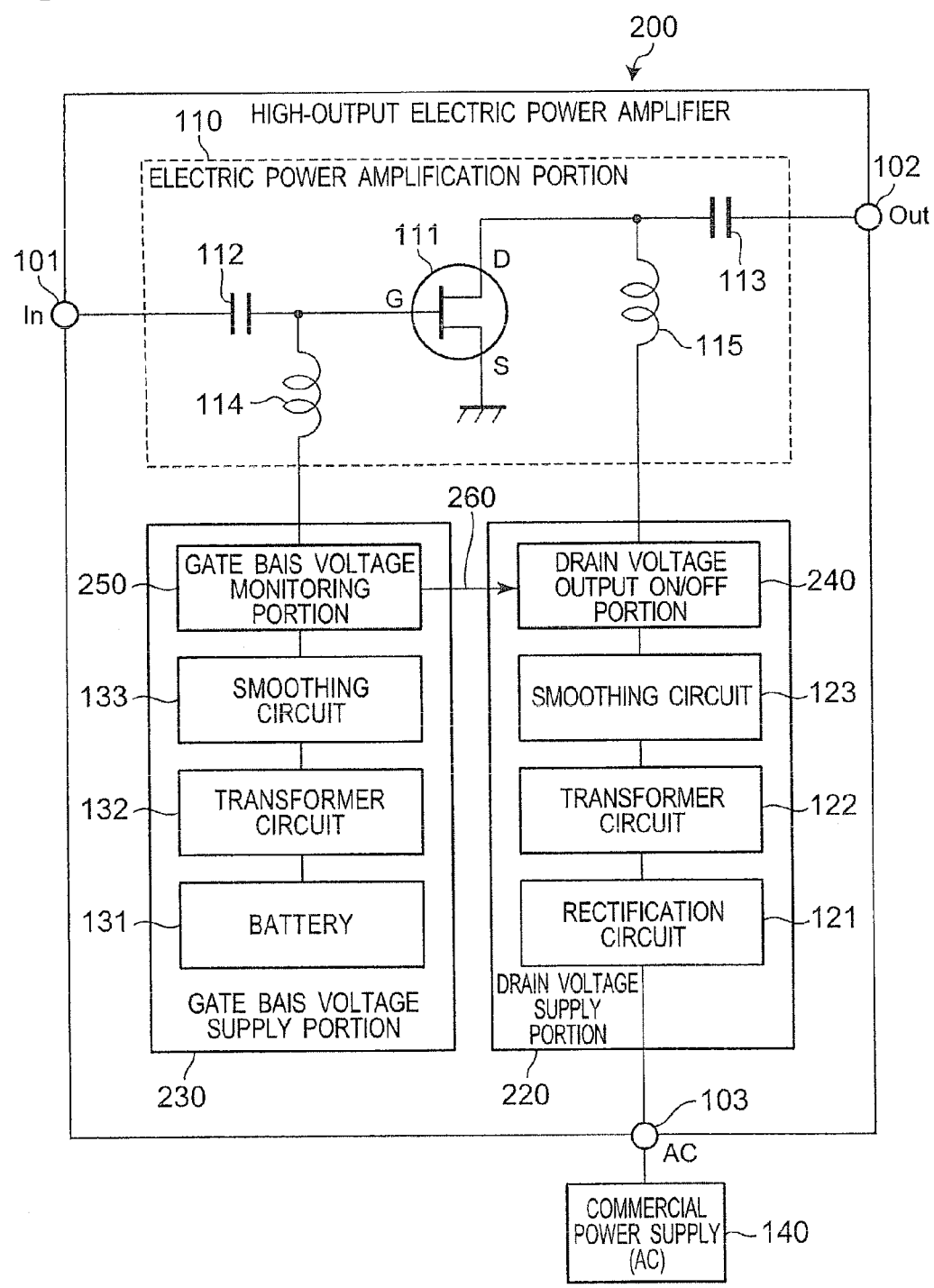
FIG. 4 is a block diagram illustrating a basic structure of a high-output electric power amplifier according to a second embodiment of the present invention.

FIG. 4 is a block diagram illustrating a basic structure of the high-output electric power amplifier 200 according to the second embodiment.

As illustrated in FIG. 4, the high-output electric power amplifier 200 according to the second embodiment includes the input terminal 101, the output terminal 102, the external power supply connection terminal 103, the electric power amplification portion 110, a drain voltage supply portion 220, and a gate bias voltage supply portion 230. Further, in FIG. 4, the high-output electric power amplifier 200 is configured to have the single electric power amplification portion 110, the single input terminal 101, and the single output terminal 102. However, the configuration of the high-output electric power amplifier according to the present invention is not limited to such a structure having a single electric power amplification portion, a single input terminal, and a single output terminal.

The drain voltage supply portion 220 includes the rectification circuit 121, the transformer circuit 122, the smoothing circuit 123 and the drain voltage ON/OFF portion 240 and, further, is connected to the external power supply connection terminal 103 and the electric power amplification portion 110. The drain voltage supply portion 220 is adapted to create a drain voltage which is a positive voltage from AC electric power inputted from the external power supply connection terminal 103 and to supply it to the electric power amplification portion 110. The concrete structure of the drain voltage supply portion 220 will be described, in detail, later.

The gate bias voltage supply portion 230 includes the battery 131, the transformer circuit 132, the smoothing circuit 133 and the gate bias monitoring portion 250, and is connected to the electric power amplification portion 110. The gate bias voltage supply portion 230 is adapted to create a gate bias voltage, which is a negative voltage, from a DC voltage output from this battery 131 and to supply it to the electric power amplification portion 110. The concrete structure of the gate bias voltage supply portion 230 will be described, in detail, later.

The gate bias voltage monitoring portion 250 in the gate bias voltage supply portion 230 is connected to the drain voltage output ON/OFF portion 240 in the drain voltage supply portion 220, and the gate bias voltage monitoring portion 250 monitors a gate bias voltage signal 260 and transmits it to the drain voltage output ON/OFF portion 240.

The external power supply connection terminal 103 is adapted to be connectable to an external commercial power supply 140 and is constituted by an outlet plug and an electric code with two or three cores, for example.

Figure 5:
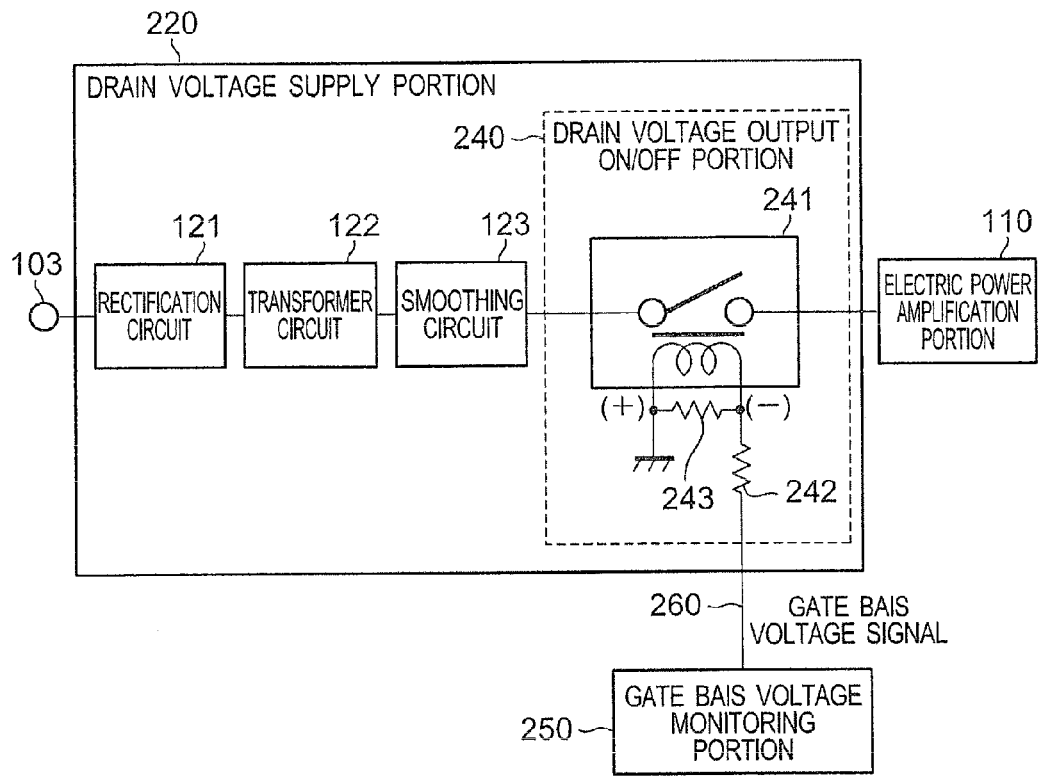
FIG. 5 is a block diagram illustrating a concrete structure of a drain voltage supply portion according to the second embodiment of the present invention.

Next, the concrete structure of the drain voltage supply portion 220 will be described, in detail. FIG. 5 is a block diagram illustrating the concrete structure of the drain voltage supply portion 220, in detail.

As illustrated in FIG. 5, the drain voltage supply portion 220 includes the rectification circuit 121, the transformer circuit 122, the smoothing circuit 123 and the drain voltage output ON/OFF portion 240, which are connected to each other in the mentioned order. The rectification circuit 121 is connected to the external power supply connection terminal 103. The drain voltage output ON/OFF portion 240 is connected to the electric power amplification portion 110 and the gate bias voltage monitoring portion 250.

The concrete structures of the rectification circuit 121, the transformer circuit 122 and the smoothing circuit 123 are the same as those in the concrete structure of the drain voltage supply portion 120 in FIG. 2, which has been described in the aforementioned first embodiment, and will not be described.

The drain voltage output ON/OFF portion 240 includes a contact relay 241, and voltage-dividing resistors 242 and 243.

The contact relay 241 is an ordinary mechanical relay and is adapted to bring its contact point into an opened or closed state, if an electric-potential difference equal to or more than a certain value is provided between the opposite ends of a control coil. In the second embodiment, the contact relay used therein is adapted to bring its contact point into an opened state (namely, an OFF state) if the electric potential difference between the opposite ends of the control coil is less than $\alpha$ V and, further, this contact relay is adapted to bring its contact point into a closed state (namely, an ON state) if the electric potential difference between the opposite ends of the control coil is equal to or more than $\alpha$ V, and the control coil is connected to GND at its (+) terminal.

The voltage-dividing resistor 242 is connected, at its one side, to the gate bias voltage monitoring portion 250 and, further, is connected, at its other side, to the negative (−) terminal of the control coil in the contact relay 241. The voltage-dividing resistor 243 is connected, at its one side, to the negative (−) terminal of the control coil in the contact relay 241 and, further, is connected, at its other side, to GND and to the positive (+) terminal of the control coil in the contact relay 241. The gate bias voltage signal 260 inputted to the voltage-dividing resistor 242 from the gate bias voltage monitoring portion 250 is subjected to the voltage dividing by the voltage-dividing resistors 242 and 243, and the result of the voltage division is inputted to the negative (−) terminal in the control coil in the contact relay 241.

In the high-output electric power amplifier 200 having the aforementioned structure according to the second embodiment, in the drain voltage output ON/OFF portion 240, if the voltage inputted to the negative (−) terminal in the control coil in the contact relay 241 is equal to or more than −$\alpha$ V, depending on the voltage of the gate bias voltage signal 260 inputted from the gate bias voltage monitoring portion 250, the contact point in the contact relay 241 is brought into an opened state, which prevents the drain voltage outputted from the smoothing circuit 123 from being transmitted to the electric power amplification portion 110. On the other hand, if the voltage inputted to the negative (−) terminal in the control coil in the contact relay 241 is less than −$\alpha$ V, the contact point in the contact relay 241 is brought into a closed state, which causes the drain voltage outputted from the smoothing circuit 123 to be transmitted to the electric power amplification portion 110.

As described above, the drain voltage supply portion 220 has the structure illustrated in FIG. 5. Therefore, the drain voltage supply portion 220 is adapted to create a drain voltage to be supplied to the electric power amplification portion 110, from the AC voltage from the external commercial power supply 140, which is inputted thereto through the external power supply connection terminal 103. Also, the drain voltage supply portion 220 is enabled to perform ON/OFF control of the supply of the drain voltage to the electric power amplification portion 110, through the gate bias voltage signal 260 inputted from the gate bias voltage monitoring portion 250.

Figure 6:
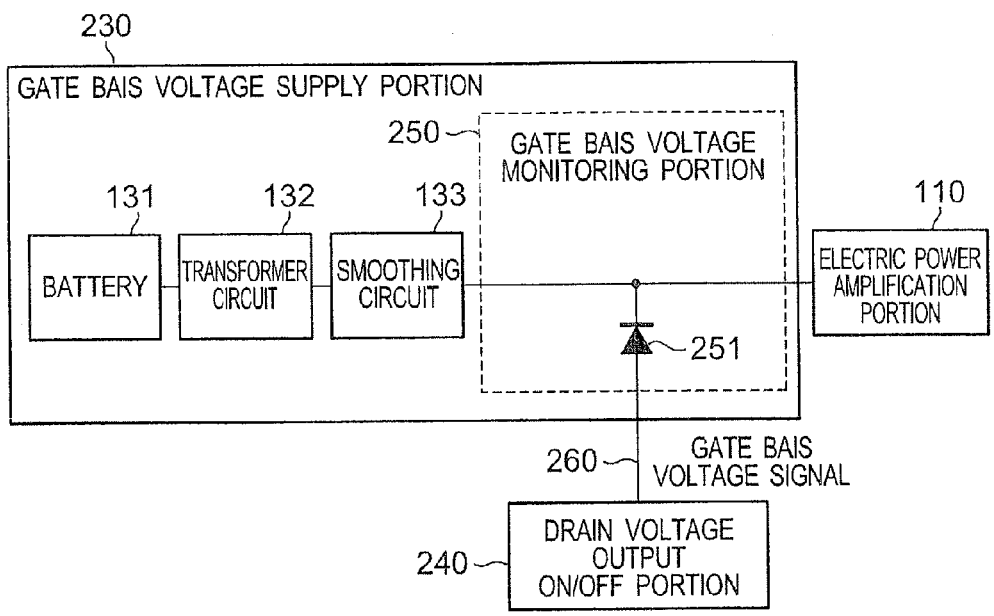
FIG. 6 is a block diagram illustrating a concrete structure of a gate bias voltage supply portion according to the second embodiment of the present invention.

Next, the concrete structure of the gate bias voltage supply portion 230 will be described, in detail. FIG. 6 is a block diagram illustrating the concrete structure of the gate bias voltage supply portion 230, in detail.

As illustrated in FIG. 6, the gate bias voltage supply portion 230 includes the battery 131, the transformer circuit 132, the smoothing circuit 133 and the gate bias voltage monitoring portion 250, which are connected to each other in the mentioned order. Further, the gate bias voltage monitoring portion 250 is connected to the electric power amplification portion 110 and the drain voltage output ON/OFF portion 240.

The concrete structures of the battery 131, the transformer circuit 132 and the smoothing circuit 133 are the same as those in the concrete structure of the gate bias voltage supply portion 130 in FIG. 3, which has been described in the aforementioned first embodiment, and will not be described.

The gate bias voltage monitoring portion 250 includes a reverse-current protecting diode 251. The reverse-current protecting diode 251 is connected, at its cathode terminal, to the path of the gate bias voltage which is inputted to the electric power amplification portion 110 from the output of the smoothing circuit 133. The reverse-current protecting diode 251 is connected, at its anode terminal, to the drain voltage output ON/OFF portion 240.

As described above, the gate bias voltage supply portion 230 has the structure illustrated in FIG. 6. Therefore, the gate bias voltage supply portion 230 is adapted to create a gate bias voltage to be supplied to the electric power amplification portion 110, from the output voltage from the battery 131. Also, the gate bias voltage supply portion 230 is adapted to transmit the voltage value of the gate bias voltage transmitted to the electric power amplification portion 110 from the smoothing circuit 133, as the gate bias voltage signal 260, to the drain voltage output ON/OFF portion 240, through the reverse-current protecting diode 251.

With the structure of the high-output electric power amplifier 200 according to the second embodiment, the drain voltage, which is a positive voltage created by the drain voltage supply portion 220 with the external commercial power supply 140 used as an electric power source, is applied to the drain terminal of the depression-type FET 111, while the gate bias voltage, which is a negative voltage created by the gate bias voltage supply portion 230 with the battery 131 used as an electric power source, is applied to the gate terminal thereof. Further, with the high-output electric power amplifier 200 according to the second embodiment, the supply of the drain voltage to the drain terminal is brought into an ON state, only when the gate bias voltage applied to the gate terminal of the depression-type FET 111 falls within the predetermined permissible range. Therefore, in the event of voltage drops and failures of the battery 131, it is possible to bring the supply of the drain voltage to the drain terminal into an OFF state, thereby certainly preventing breakdowns of the FET due to excessive electric currents.

Third Embodiment

Hereinafter, a high-output electric power amplifier according to a third embodiment of the present invention will be described, with reference to the accompanying drawings.

Further, in the high-output electric power amplifier according to the aforementioned second embodiment, the gate bias voltage supply portion is constituted by the battery 131, the transformer circuit 132 and the smoothing circuit 133 which are adapted to output a gate bias voltage which is a negative voltage, from the output voltage from the battery 131, and the gate bias voltage monitoring portion 250 for determining whether or not the gate bias voltage falls within a predetermined permissible range. In comparison with the high-output electric power amplifier having the aforementioned structure according to the second embodiment, the high-output electric power amplifier according to the third embodiment is adapted to include a gate bias voltage supply portion which employs a rechargeable battery, instead of a battery, and further includes a charging circuit for charging the rechargeable battery, and a battery-level monitoring portion for monitoring the value of the output voltage from the rechargeable battery, in addition to a transformer circuit 132, a smoothing circuit 133 and a gate bias voltage monitoring portion 250. With regard to these points, the structure according to the third embodiment is different from the structure according to the second embodiment.

In the high-output electric power amplifier having the aforementioned structure according to the third embodiment, the rechargeable battery is automatically charged, at a time point when the output voltage from the rechargeable battery has dropped to a certain voltage due to discharge. This enables continuously maintaining a voltage equal to or more than a certain value, from the rechargeable battery as the electric power source for the gate bias voltage, which can eliminate the labor for replacement of the battery. Further, with the high-output electric power amplifier according to the third embodiment, it is possible to eliminate concerns about drops of the voltage from the rechargeable battery, even when it is continuously operated. This enables continuously applying a stabilized gate bias voltage to the gate terminal. As a result thereof, with the high-output electric power amplifier according to the third embodiment, it is possible to certainly prevent breakdowns of the FET due to excessive electric currents.

Hereinafter, the high-output electric power amplifier according to the third embodiment will be described, mainly with respect to the differences thereof from the high-output electric power amplifier according to the second embodiment. Further, in the description of the third embodiment, components having the same functions as those in the aforementioned second embodiment will be designated by the same reference characters and will not be described. Further, in the description of the third embodiment, similarly, contents having the same effects as those in the aforementioned second embodiment will not be described.

Figure 7:
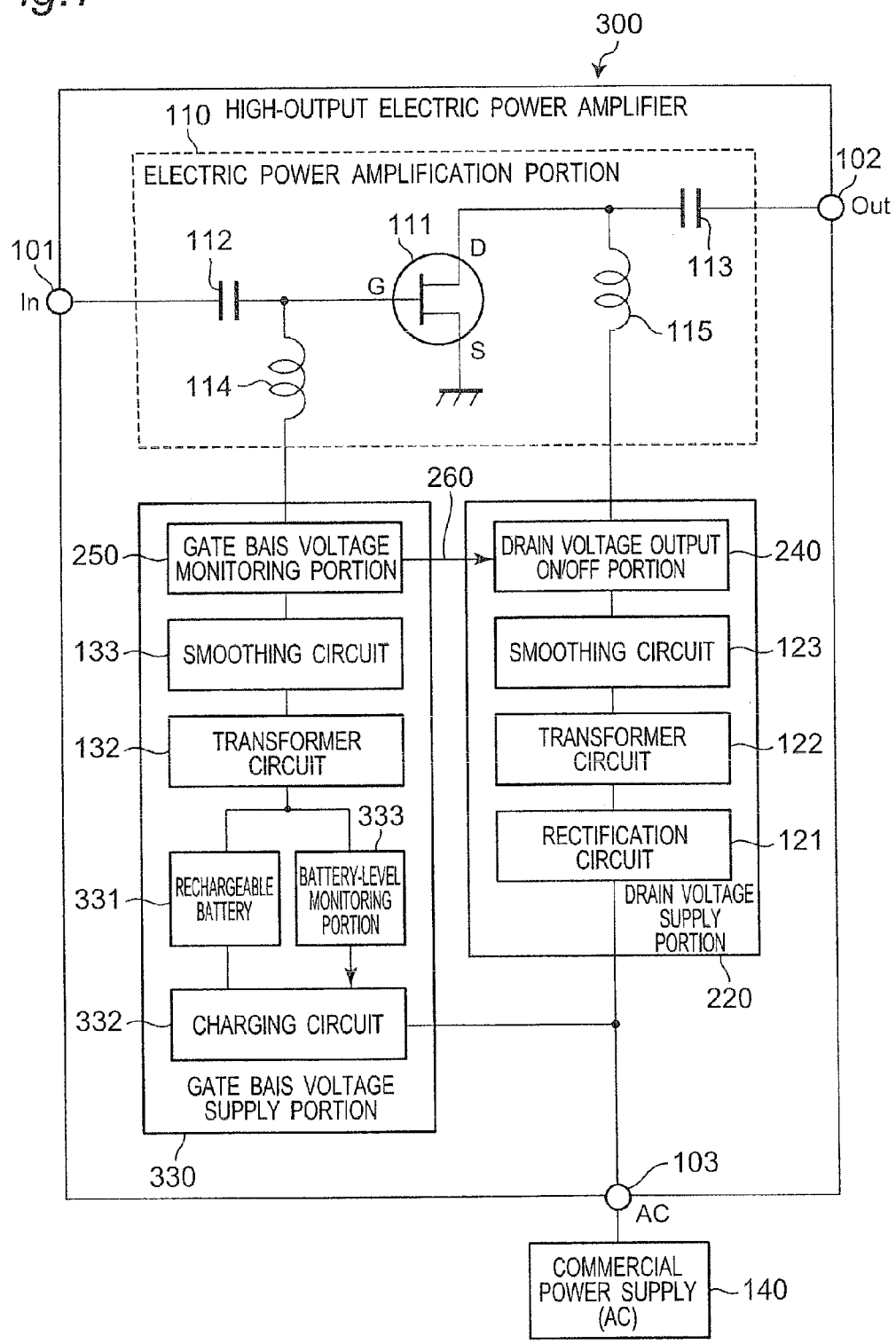
FIG. 7 is a block diagram illustrating a basic structure of a high-output electric power amplifier according to a third embodiment of the present invention.

FIG. 7 is a block diagram illustrating a basic structure of the high-output electric power amplifier 300 according to the third embodiment.

As illustrated in FIG. 7, the high-output electric power amplifier 300 according to the third embodiment includes the input terminal 101, the output terminal 102, the external power supply connection terminal 103, the electric power amplification portion 110, the drain voltage supply portion 220, and a gate bias voltage supply portion 330. Further, in FIG. 7, the high-output electric power amplifier 300 is configured to have the single electric power amplification portion 110, the single input terminal 101, and the single output terminal 102. However, the structure of the high-output electric power amplifier according to the present invention is not limited to such a structure having a single electric power amplification portion, a single input terminal, and a single output terminal.

The structure of the drain voltage supply portion 220 is the same as the concrete structure of the drain voltage supply portion 220 in FIG. 5, which has been described in the aforementioned second embodiment, and will not be described.

The gate bias voltage supply portion 330 includes a rechargeable battery 331, a charging circuit 332, a battery-level monitoring portion 333, the transformer circuit 132, the smoothing circuit 133, and the gate bias voltage monitoring portion 250. In the gate bias voltage supply portion 330, the rechargeable battery 331, the transformer circuit 132, the smoothing circuit 133, and the gate bias voltage monitoring portion 250 are connected to each other in the mentioned order. The gate bias voltage monitoring portion 250 is connected to the electric power amplification portion 110 and the drain voltage output ON/OFF portion 240. The charging circuit 332 is connected to the rechargeable battery 331, the battery-level monitoring portion 333 and the external power supply connection terminal 103, and the battery-level monitoring portion 333 is connected to the output of the rechargeable battery 331 and to the charging circuit 332.

The concrete structures of the transformer circuit 132, the smoothing circuit 133 and the gate bias voltage monitoring portion 250 are the same as those in the concrete structure of the gate voltage supply portion 230 in FIG. 6, which has been described in the aforementioned second embodiment, and will not be described.

The rechargeable battery 331 is an ordinary secondary battery and can be constituted by a lithium-ion secondary battery, a nickel-cadmium secondary battery, or the like. It is desirable that the secondary battery used as the rechargeable battery 331 is constituted by a secondary battery having a smaller memory effect.

The battery-level monitoring portion 333 monitors the output voltage from the rechargeable battery 331 and controls the charging circuit 332 for causing it to start charging the rechargeable battery 331, when the output voltage from the rechargeable battery 331 has reduced to a first value. Further, the battery-level monitoring portion 333 controls the charging circuit 332 for causing it to stop the charging, when the output voltage from the rechargeable battery 331 has reached a second value.

The charging circuit 332 can be constituted by an ordinary AC/DC conversion circuit adapted to convert the AC voltage inputted thereto through the external power supply connection terminal 103 into a voltage suitable for charging the rechargeable battery 331. The battery-level monitoring portion 333 controls the charging circuit 332 for causing it to start and stop charging.

The external power supply connection terminal 103 is adapted to be connectable to an external commercial power supply 140 and is constituted by an outlet plug and an electric code with two or three cores, for example.

In the high-output electric power amplifier 300 having the aforementioned structure according to the third embodiment, the rechargeable battery 331 is automatically charged, at a time point when the output voltage from the rechargeable battery 331 has dropped to a certain voltage due to discharge. This enables continuously maintaining a voltage equal to or more than a certain value, from the rechargeable battery 331 as the electric power source for the gate bias voltage, which can eliminate the labor for replacement of the battery, in the high-output electric power amplifier 300 according to the third embodiment. Further, with the high-output electric power amplifier 300 according to the third embodiment, it is possible to eliminate concerns about drops of the voltage from the rechargeable battery 331, even when it is continuously operated. This enables continuously applying a stabilized gate bias voltage to the gate terminal in the depression-type FET 111. As a result thereof, with the high-output electric power amplifier 300 according to the third embodiment, it is possible to certainly prevent breakdowns of the FET due to excessive electric currents.

INDUSTRIAL APPLICABILITY

With the present invention, it is possible to certainly prevent breakdowns of the FET due to excessive electric currents, even in the event of accidental power supply shutdowns, and malfunctions and failures of the control microcomputer, in the high-output electric power amplifier which is configured to include the depression-type FET as an amplification device and is adapted to amplify high-frequency electric power of several tens of watts to several hundreds of watts. Therefore, the present invention is a technique usable in cooking apparatuses such as microwave ovens, and various consumer apparatuses utilizing high-frequency heating, which are used in vehicles and households.

The invention claimed is:

1. A high-output electric power amplifier configured to include a depression-type FET as an amplification device, the high-output electric power amplifier comprising:
   a drain voltage supply portion adapted to create and output a positive voltage to be applied to a drain terminal in the depression-type FET; and
   a gate bias voltage supply portion adapted to create and output a negative voltage to be applied to a gate terminal in the depression-type FET,
   wherein the high-output electric power amplifier is configured that the drain voltage supply portion uses an external commercial power supply as an electric power source, and the gate bias voltage supply portion uses a battery as an electric power source.

2. The high-output electric power amplifier according to claim 1, wherein
   the gate bias voltage supply portion includes
   a battery forming an electric power source for a gate bias voltage,
   a transformer circuit and a smoothing circuit which are adapted to create a negative voltage to be applied to the gate terminal in the depression-type FET, from an output voltage from the battery, and
   a gate bias voltage monitoring portion adapted to monitor the gate bias voltage applied to the gate terminal in the depression-type FET, which is created by the transformer circuit and the smoothing circuit,
   the drain voltage supply portion includes
   a rectification circuit, a transformer circuit and a smoothing circuit which are adapted to create a positive voltage to be applied to the drain terminal in the depression-type FET, from electric power supplied from the external commercial power supply, and
   a drain voltage output ON/OFF portion which is adapted to turn on/off the output of the positive voltage applied to the drain terminal in the depression-type FET, which is created by the rectification circuit, the transformer circuit and the smoothing circuit,
   the gate bias voltage monitoring portion is adapted to output, to the drain voltage output ON/OFF portion, a control signal indicative of the fact that the gate bias voltage is normal, when the gate bias voltage applied to the gate terminal in the depression-type FET falls within a predetermined permissible range, and
   the drain voltage output ON/OFF portion is adapted to output the drain voltage, only when receiving the control signal outputted from the gate bias voltage monitoring portion.

3. The high-output electric power amplifier according to claim 2, wherein
   the drain voltage output ON/OFF portion is configured to employ, as an opening/closing device, a contact relay adapted to be closed only in a state where a control signal is inputted to an opening/closing control terminal.

4. The high-output electric power amplifier according to claim 2, wherein
   the gate bias voltage supply portion includes a rechargeable battery forming an electric power source for the gate bias voltage,
   a charging circuit adapted to charge the rechargeable battery, and
   a battery-level monitoring portion adapted to monitor an output voltage from the rechargeable battery, and wherein
   the charging circuit is connected to the external commercial power supply and is adapted to perform an operation for charging the rechargeable battery, when the value from the battery-level monitoring portion reaches a first value.

* * * * *